United States Patent
Wise et al.

[11] Patent Number: 6,020,262
[45] Date of Patent: *Feb. 1, 2000

[54] METHODS AND APPARATUS FOR CHEMICAL MECHANICAL PLANARIZATION (CMP) OF A SEMICONDUCTOR WAFER

[75] Inventors: Michael Lester Wise, Poughkeepsie; Jeremy Kaspar Stephens, Wappingers Falls; Suri G. Hedge, Hollowville, all of N.Y.

[73] Assignees: Siemens Aktiengesellschaft, Munich, Germany; International Business Machines Corp., Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 09/036,478

[22] Filed: Mar. 6, 1998

[51] Int. Cl.[7] .................................................. H01L 21/302

[52] U.S. Cl. ............................ 438/691; 438/692; 438/693

[58] Field of Search ..................................... 438/690, 691, 438/692, 693

[56] References Cited

U.S. PATENT DOCUMENTS

| | | | |
|---|---|---|---|
| 4,450,652 | 5/1984 | Walsh | 451/288 |
| 5,196,353 | 3/1993 | Sandhu et al. | 438/692 |
| 5,643,060 | 7/1997 | Sandhu et al. | 451/285 |
| 5,700,180 | 12/1997 | Sandhu et al. | 451/288 |
| 5,762,537 | 6/1998 | Sandhu et al. | 451/288 |
| 5,842,909 | 12/1998 | Sandhu et al. | 451/288 |

*Primary Examiner*—Benjamin Utech
*Assistant Examiner*—Kin-Chan Chen
*Attorney, Agent, or Firm*—Donald B. Paschburg

[57] ABSTRACT

Areas of different temperatures are provided on a semiconductor wafer to improve uniformity in polishing rates during CMP.

11 Claims, 3 Drawing Sheets

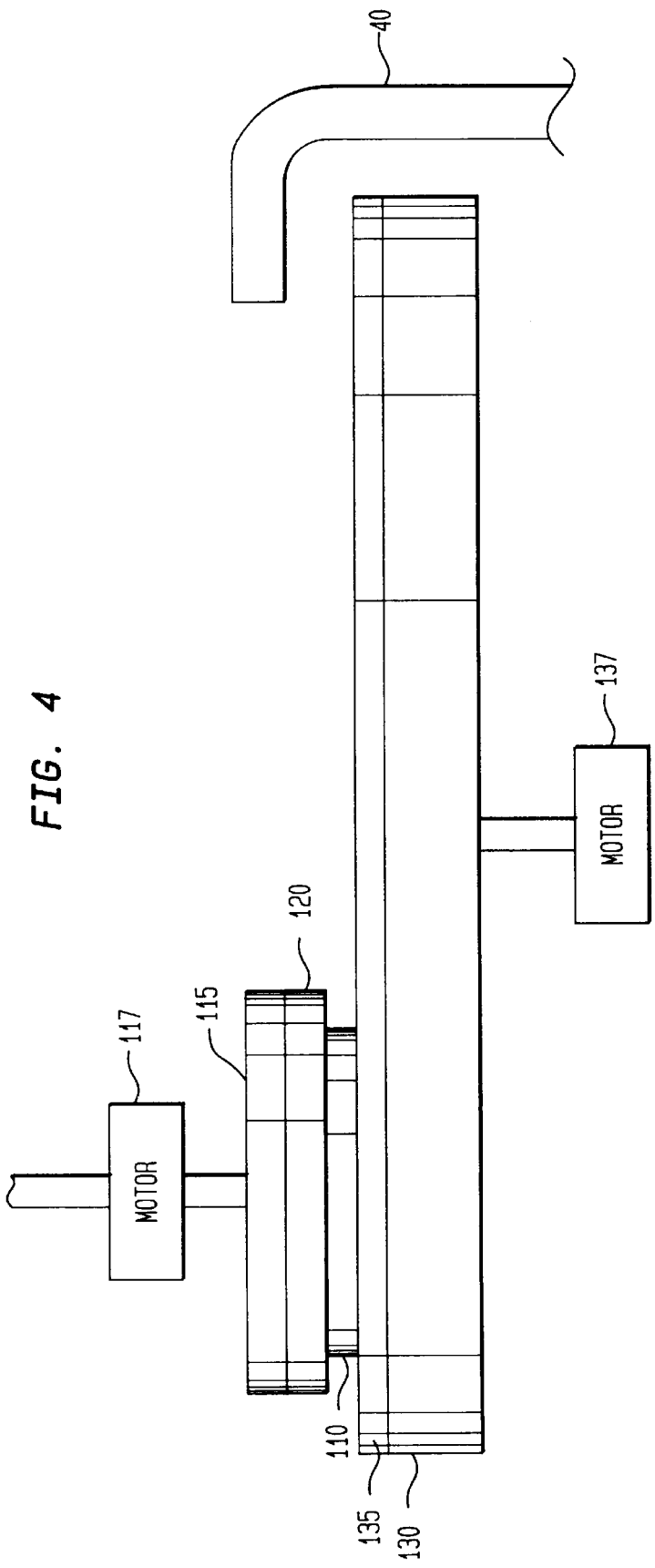

METHODS AND APPARATUS FOR CHEMICAL MECHANICAL PLANARIZATION (CMP) OF A SEMICONDUCTOR WAFER

BACKGROUND

1. Technical Field

This disclosure relates to semiconductor manufacture and more particularly to methods and apparatus that employ differential heating of a semiconductor during chemical mechanical planarization of semiconductor wafers.

2. Background of Related Art

In the fabrication of integrated circuits, it is often necessary to polish a side of a part such as a thin flat wafer of a semiconductor material. In general, a semiconductor wafer can be polished to provide a planarized surface to remove topography or surface defects such as a crystal lattice damage, scratches, roughness, or embedded particles such as dirt or dust. This polishing process is often referred to as mechanical planarization or chemical mechanical planarization ("CMP") and is utilized to improve the quality and reliability of semiconductor devices. The CMP process is usually performed during the formation of various devices and integrated circuits on the wafer.

In general, the chemical mechanical planarization process involves holding a thin flat wafer of semiconductor material against a rotating wetted polishing surface under a controlled downward pressure. A polishing slurry such as a solution of alumina or silica may be utilized as the abrasive medium. A rotating polishing head or wafer carrier is typically utilized to hold the wafer under controlled pressure against a rotating polishing platen. A backing film is optionally positioned between the wafer carrier and the wafer. The polishing platen is typically covered with a relatively soft wetted pad material such as blown polyurethane.

Non-uniformities in polishing rate can result in unwanted irregularities in the semiconductor wafer. Among the factors that can result in non-uniformities in polishing rate are non-uniform distribution of polishing slurry, an unevenly conditioned polishing pad, and an uneven application of pressure to the polishing pad.

A particular problem encountered in the chemical mechanical planarization process is known in the art as the "loading effect". When the wafer is pressed against a relatively soft polishing pad on the polishing platen of the chemical mechanical planarization apparatus, the polishing pad may deform into the area between the structures to be removed, especially when the polishing rate of the structures is different then the polishing rate of the areas between the structures. This may cause an irregular or wavy surface to be formed on the wafer. In general, this phenomena occurs on the micro level and has an adverse affect on the integrated circuits formed on the wafer, especially in high density applications.

Another example of the loading effect is experienced when a protective or insulating layer of a dielectric material such as, for example, borophosphorus silicate glass, is deposited over transistors formed on a substrate. An initial conformal deposition of the protective layer may produce an irregular surface with peaks directly above the transistors and valleys between the transistors. As before, the polishing pad may deform to accommodate the irregular surface of the protective or dielectric layer. The resultant polished surface may appear on the micro level as wavy or irregular.

The loading effect may function in other situations to remove the sides and base of features present on the surface of a wafer during chemical mechanical planarization. In addition, the loading effect may occur locally or globally across the surface of the wafer. This problem may be compounded by the velocity differential between the outer peripheral portions and the interior portions of the rotating semiconductor wafer. The faster moving peripheral portions of the semiconductor wafer may, for instance, experience a relatively larger rate of material removal than the relatively slower moving interior portions.

In view of the foregoing, there is a need in semiconductor manufacture for a chemical mechanical planarization process that overcomes the loading effect. Accordingly, it is an object of the present invention to provide to lessen or eliminate non-uniformities in polishing rates during CMP.

SUMMARY OF THE INVENTION

It has now been found that providing areas of different temperature on the wafer can be advantageously employed to reduce or eliminate problems of uneven rates of polishing that may be encountered when polishing semiconductor wafers. Specifically, the apparatus described herein include temperature regulating means for increasing the temperature of a first portion of a semiconductor wafer relative to the temperature of a second portion of the semiconductor wafer. The temperature regulating means can cool or heat a desired portion of the semiconductor wafer to provide areas of different temperature on the semiconductor wafer. Methods of polishing semiconductor wafers by providing areas of different temperature on the semiconductor wafer are also described.

BRIEF DESCRIPTION OF THE DRAWINGS

FIG. 4 shows an alternative embodiment of a polishing apparatus in accordance with this disclosure.

DETAILED DESCRIPTION OF THE INVENTION

The invention relates to fabrication of integrated circuits (ICs). The ICs, for example, include memory ICs such as random access memories (RAMs), dynamic random access memories (DRAMs), or synchronous DRAMs(SDRAMs). The ICs may also include other types of circuits such as application specific ICs (ASICs), merged DRAM-logic circuits (embedded DRAMs), or other logic circuits.

Typically, numerous ICs are formed on the wafer in parallel. After processing is finish, the wafer is diced to separate the integrated circuits to individual chips. The chips are then packaged, resulting in a final product that is used in, for example, consumer products such as computer systems, cellular phones, personal digital assistants (PDAs), and other electronic products.

One embodiment of the present invention described herein involves providing areas of different temperature on a semiconductor wafer being subjected to CMP. The invention is based not only on the discovery that the temperature of the wafer will affect the rate of polishing, but also on the discovery that temperature variations can be achieved within the water on a scale that allows the desired variations in polishing rate to be of practical value in improving CMP uniformity.

Figure 1:
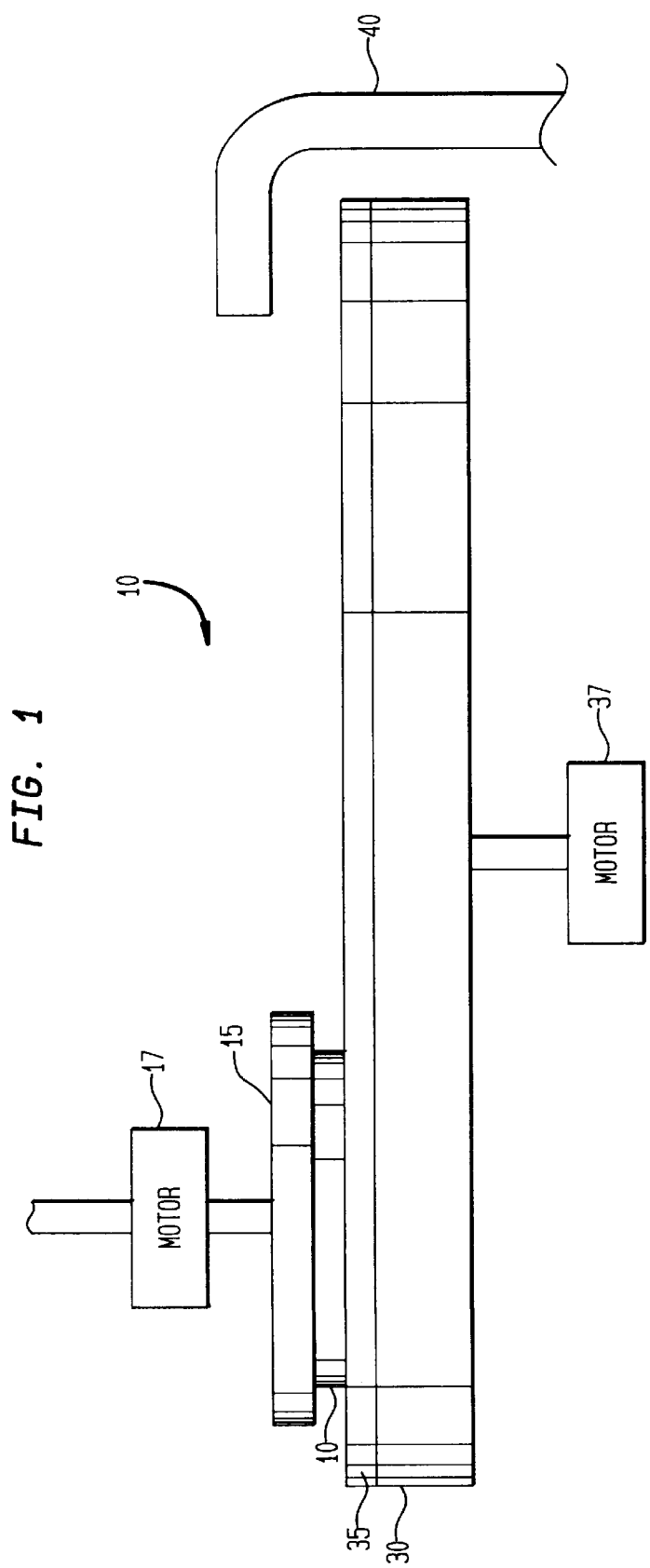
FIG. 1 shows a schematic view of a polishing apparatus in accordance with this disclosure.

As seen in FIG. 1, a chemical mechanical polishing apparatus includes a wafer carrier 15 for holding wafer 10. Motor 17 can be used to rotate carrier 15. Polishing platen 30, which carries polishing pad 35, can be rotated by motor 37. A polishing slurry can be applied to polishing pad 35 via conduit 40. Wafer 10 is pressed against polishing pad 35, preferably at a constant pressure. Slurry compositions, rotation speeds and the amount of pressure to be used are within the purview of those skilled in the art.

Figure 2:
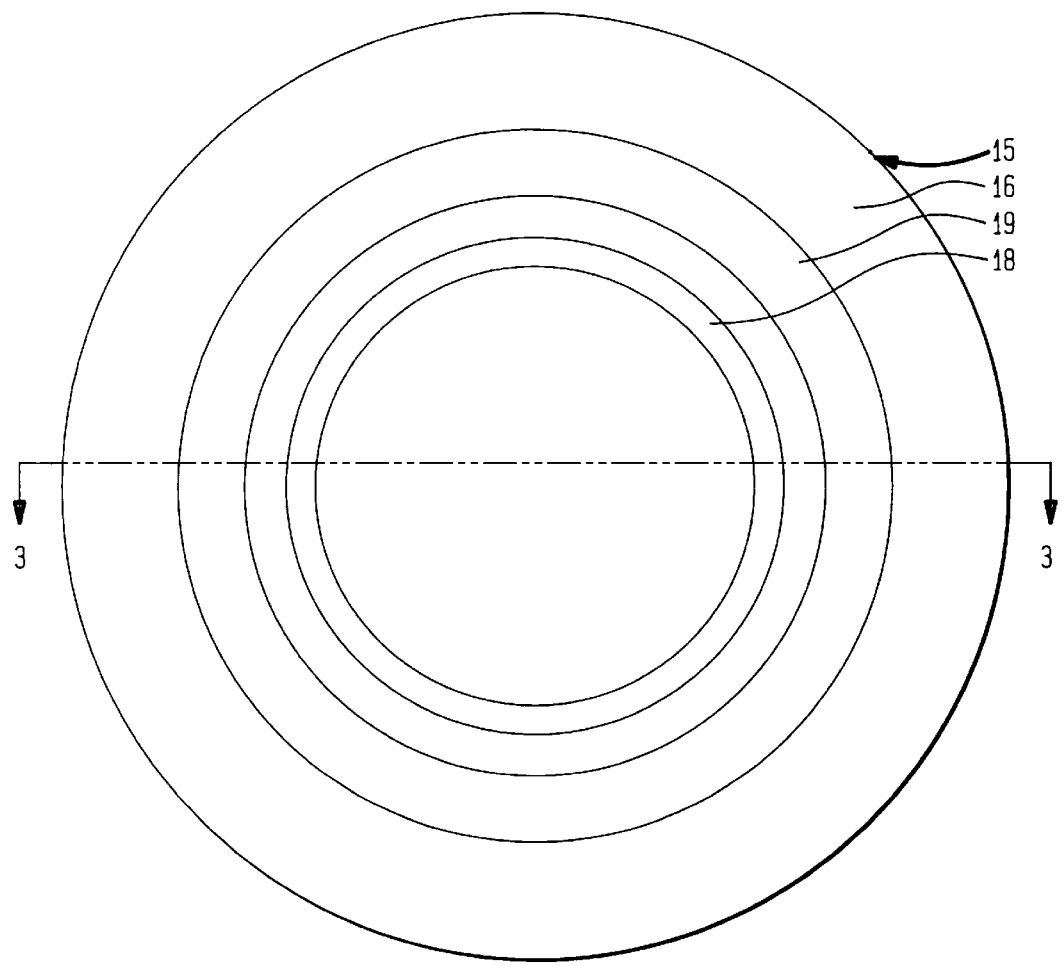
FIG. 2 shows a schematic view of the rear side of an embodiment of a wafer carrier useful in a CMP process in accordance with this disclosure.

To carry out the novel invention described herein, heat or cooling is applied to portions of wafer carrier 15 by a temperature controller. Where heat is to be applied to portions of the wafer carrier, any type of conventional heater can be employed, provided it can be adapted to the physical constraints of the wafer carrier and the degree of heating can be carefully controlled. Thus, heating can be accomplished, for example, by a resistive heater, an induction heater, or a radiant heater or by exposure to light energy (e.g., laser) or RF energy, or by contacting the carrier with heated fluids, including gasses, liquids or both as well as thermoelectric heating. As shown in FIG. 2, annular tapes 18, 19 containing resistive heating wires can be applied to the rear side 16 of carrier 15 to provide localized heating.

Figure 3:
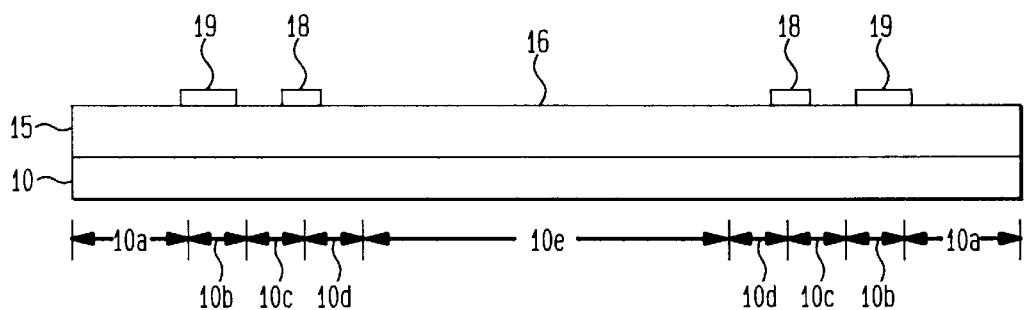
FIG. 3 shows a schematic cross-sectional view of the wafer carrier of FIG. 2.

As best seen in FIG. 3, once heater tapes 18, 19 are activated, the heat will be conducted through wafer carrier 15 and differential heating will be experienced in wafer 10. Thus, for example, portion 10a of wafer 10 will be cooler than adjacent portion 10b which will be affected by heating tape 19. Similarly, portion 10b of wafer 10 will be relatively warm compared to adjacent portion 10c which is substantially unaffected by either heating elements 18, 19. Due to the effects of heating tape 18, portion 10d will be maintained at a relatively higher temperature than either of portions 10c or 10e.

It should be understood that the heating capacity of elements 18, 19 need not be the same. Rather, portions 10b and 10d can be heated to different temperatures by employing heaters having different heat outputs. It is further contemplated that instead of heating selected portions of carrier 15, the temperature controller can be used to cool a portion of the wafer. Cooling elements can be employed in essentially the same manner as the previously described heating elements to cool areas of the carrier and thereby cool portions of wafer 10. Any conventional cooling mechanism can be employed, such as, for example, thermoelectric cooling. A preferred cooling mechanism, however, is to contact rear side 16 of carrier 15 with a cooling fluid, either directly or within one or more conduits (not shown). In yet another embodiment, one portion of wafer 10 is subjected to heating while another portion is simultaneously subjected to cooling by the temperature regulating controller.

In yet another embodiment shown in FIG. 4, uniform heating or cooling is applied to the wafer carrier 15 and a backing film 120 having a heat transfer gradient can be interposed between wafer 110 and wafer carrier 115. A suitable backing film 120 will include at least one area of relatively high heat transfer and at least one area of low heat transfer. By providing a backing film with such a heat transfer gradient, greater polishing uniformity can be achieved. The heat transfer gradient can be imparted to the backing film in any number of ways. For example, where the backing film is made from a synthetic polymeric material, the characteristics (e.g., crystallinity, density, etc.) or composition of the polymer can be varied in different areas of the backing film. Alternatively, a heat transfer gradient can be achieved by providing different degrees of porosity in different sections of the backing film. In yet another embodiment, a heat transfer gradient can be established within the backing film by incorporating more of a particulate filler having a high heat transfer coefficient in a given area of the backing film and less filler in a different area.

As discussed, non-uniformity in polishing rate is created by the polishing tool and substrate. However, the ability to control the temperature in different regions of the wafer allows a user to adjust the polishing rate in the different regions to result in a more uniform polishing rate across the wafer. For example, those regions of the wafer with a slower polishing rate are heated to a higher temperature to increase the polishing rate therein. Typically, the edge of the wafer has a faster polishing rate than the center of the wafer. As such, the center of the wafer would be heated to increase its polishing rate so that it equals that of the edge. Alternatively, a combination of heating those regions with slower polishing rate and cooling those regions with higher polishing rate is also effective in provide a more uniform polishing rate across the wafer.

The temperatures employed during CMP will depend on a number of factors including the materials contained in the semiconductor wafer, the diameter and thickness of the wafer, the nature and amount of the slurry employed and the rates at which the wafer carrier and polishing plates are rotated. Normally, however, portions of the wafer can be heated to a temperature in the range of 30 to 80 degrees C or cooled to a temperature in the range of 20 to −20 degrees C. Preferably, the difference between the warm portion of the wafer and the cool portion of the wafer is in the range of 1 to 40° C. Additionally, the temperature differentials can be provided on a sufficiently small scale to adequately define the boundaries of the warmer and cooler portions of the wafer and thereby tightly control the polishing rates of adjacent portions. In this manner, uniform polishing rates can be achieved in a custom manner for wafers of different configurations and/or compositions.

Although the present invention has been described with a certain degree of particularity, many changes and variations are possible therein and will be apparent to those skilled in the art after reading the foregoing description. For example, while the embodiments described herein illustrate annular heating elements 18, 19, configurations employing any geometrical configuration can be envisioned. It is therefore to be understood that the present invention may be practiced otherwise than as specifically described herein without departing from the spirit and scope thereof.

What is claimed is:

1. A method of polishing a semiconductor wafer comprising:

providing a wafer having a first portion and a second portion, the first portion being at a higher temperature than the second portion by holding a wafer within a wafer carrier and heating a first portion of the wafer carrier while simultaneously cooling a second portion of the wafer carrier; and contacting the wafer with a rotating polishing pad.

2. A method as in claim 1 wherein the step of providing a wafer comprises holding a wafer within a wafer carrier and heating a portion of the wafer carrier.

3. A method as in claim 2 wherein the step of providing a wafer comprises holding a wafer within a wafer carrier and cooling a portion of the wafer carrier.

4. A method as in claim 3 wherein the step of providing a wafer comprises contacting a portion of the wafer carrier with a cooling fluid.

5. A method as in claim 2 wherein the step of providing a wafer comprises directing laser energy at a portion the wafer carrier.

6. A method as in claim 2 wherein the step of providing a wafer comprises interposing a backing film between the wafer and the wafer carrier, the backing film having a first portion and a second portion, the first portion having a rate of heat transfer different from that of the second portion; and regulating the temperature of the wafer carrier.

7. A method as in claim 6 wherein the step of regulating the temperature of the wafer carrier comprises heating the wafer carrier.

8. A method as in claim 1 wherein the first portion is circular in shape and the second portion is disposed circumferentially outwardly of the first portion.

9. A method as in claim 1 wherein the second portion is circular in shape and the first portion is disposed circumferentially outwardly of the second portion.

10. A method of polishing a semiconductor wafer comprising:

providing a wafer having a first portion and a second portion, the first portion being at a higher temperature than the second portion by holding a wafer within a wafer carrier and heating a portion of the wafer carrier and interposing a backing film between the wafer and the wafer carrier, the backing film having a rate of heat transfer different from that of the second portion;

regulating the temperature of the wafer carrier; and contacting the wafer with a rotating polishing pad.

11. A method of polishing a semiconductor wafer comprising:

providing a wafer having a first portion and a second portion, the first portion being at a higher temperature than the second portion by separately controlling temperatures of the first portion and the second portion by holding a wafer within a wafer carrier and heating a first portion of the wafer carrier while simultaneously cooling a second portion of the wafer carrier; and contacting the wafer with a rotating polishing pad.

* * * * *